US010671559B2

(12) United States Patent
Mohseni et al.

(10) Patent No.: US 10,671,559 B2
(45) Date of Patent: Jun. 2, 2020

(54) CHIPS INCLUDING CLASSICAL AND QUANTUM COMPUTING PROCESSORS

(71) Applicant: Google LLC, Mountain View, CA (US)

(72) Inventors: Masoud Mohseni, Redondo Beach, CA (US); Hartmut Neven, Malibu, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/127,695

(22) PCT Filed: Mar. 23, 2015

(86) PCT No.: PCT/US2015/022035
§ 371 (c)(1),
(2) Date: Sep. 20, 2016

(87) PCT Pub. No.: WO2015/143439
PCT Pub. Date: Sep. 24, 2015

(65) Prior Publication Data
US 2017/0177534 A1 Jun. 22, 2017

Related U.S. Application Data

(60) Provisional application No. 61/968,993, filed on Mar. 21, 2014.

(51) Int. Cl.
*G06F 13/40* (2006.01)
*G06N 10/00* (2019.01)
(Continued)

(52) U.S. Cl.
CPC .......... *G06F 13/4068* (2013.01); *G06F 15/80* (2013.01); *G06N 10/00* (2019.01);
(Continued)

(58) Field of Classification Search
CPC ..... G06F 13/4068; G06F 15/80; G06N 10/00; H03K 19/195; H01L 27/18; H01L 39/025;
(Continued)

(56) References Cited

U.S. PATENT DOCUMENTS 6,894,392 B1 * 5/2005 Gudesen .................. G11C 5/02
257/759
7,418,283 B2 8/2008 Amin
(Continued)

FOREIGN PATENT DOCUMENTS

EP 0568455 A1 11/1993

OTHER PUBLICATIONS

Blais et al. Cavity quantum electrodynamics for superconducting electrical circuits: An architecture for quantum computation; Physical Review A 69, 062320 (2004) [serialonline], [retrieved on Mar. 19, 2018]. Retrieved from the Internet <URL:https://rsl.yale.edu/sites/default/files/physreva.69.pdf.cavity_quantum_electro.pdf>.*

(Continued)

*Primary Examiner* — Eric T Oberly
(74) *Attorney, Agent, or Firm* — Fish & Richardson P.C.

(57) ABSTRACT

An apparatus includes a substrate, a classical computing processor formed on the substrate, a quantum computing processor formed on the substrate, and one or more coupling components between the classical computing processor and the quantum computing processor, the one or more coupling components being formed on the substrate and being configured to allow data exchange between the classical computing processor and the quantum computing processor.

21 Claims, 11 Drawing Sheets

(51) Int. Cl.
  *H03K 19/195* (2006.01)
  *H01L 27/18* (2006.01)
  *H01L 39/22* (2006.01)
  *G06F 15/80* (2006.01)
  *H01L 39/02* (2006.01)
  *H01P 5/08* (2006.01)

(52) U.S. Cl.
  CPC ............ *H01L 27/18* (2013.01); *H01L 39/025* (2013.01); *H01L 39/223* (2013.01); *H01P 5/08* (2013.01); *H03K 19/195* (2013.01); *Y02D 10/14* (2018.01); *Y02D 10/151* (2018.01)

(58) Field of Classification Search
  CPC ......... H01L 39/223; H01P 5/08; Y02D 10/14; Y02D 10/151
  See application file for complete search history.

(56) References Cited

U.S. PATENT DOCUMENTS

| | | | | |
|---|---|---|---|---|
| 7,875,876 | B1* | 1/2011 | Wandzura | B82Y 10/00 257/26 |
| 9,520,180 | B1* | 12/2016 | Mukhanov | G11C 11/44 |
| 2007/0239366 | A1* | 10/2007 | Hilton | B82Y 10/00 702/27 |
| 2011/0089405 | A1* | 4/2011 | Ladizinsky | B82Y 10/00 257/31 |
| 2011/0133770 | A1* | 6/2011 | Przybysz | B82Y 10/00 326/5 |
| 2013/0043600 | A1 | 2/2013 | Sadaka | |
| 2013/0308956 | A1 | 11/2013 | Meyers et al. | |

OTHER PUBLICATIONS

Jagtap, Maheshkumar P., Era of Multi-Core Processors, DRDO Science Spectrum, Mar. 2009, p. 87-94, [[retrieved on Sep. 21, 2018]. Retrieved from the Internet <URL: https://pdfs.semanticscholar.org/f0f5/2dea80b79d9bc539b642bef3f71d7e8f13bd.pdf> (Year: 2009).*

Fujimaki, Akira et al. Bit-Serial Single Flux Quantum Microprocessor Core. IEICE Trans. Electron., vol. E91-C, No. 3, Mar. 2008. [retrieved on Mar. 14, 2019]. Retrieved from the Internet: <URL:https://www.jstage.jst.go.jp/article/transele/E91.C/3/E91.C_3_342/_pdf/-char/en>. (Year: 2008).*

Herr et al., Ultra-low-power superconductor logic; J. Appl. Phys. 109, 103903 (2011); https://doi.org/10.1063/1.3585849 Published Online: May 17, 2011. (Year: 2011).*

Extended European Search Report issued in European Application No. 15765127.4, dated Oct. 24, 2017, 16 pages.

Kane. "A Silicon-based nuclear spin quantum computer," Nature vol. 393(6681) May 14, 1998, 5 pages.

Yorozu et al. "Sub-Kelvin single flux quantum control circuits and multi-chip packaging for supporting superconducting qubit," Journal of Physics,: Conference Series, Institute of Physics, Publishing, vol. 43(1), Jun. 1, 2006, 4 pages.

Andreas Dewes. "Demonstrating Quantum Speed-Up with a Two-Transmon Quantum Processor," Theses de Universit'e Pierre et Marie Curie—Paris VI, 2012; Publication [online]. Nov. 15, 2012 [retrieved Sep. 20, 2016]. Retrieved from the Internet: URL: https://tel.archives-ouvertes.fr/tel-00857654/file/thesis_Dewes_web.pdf ; 205 pages.

International Search Report and Written Opinion in Application No. PCT/US2015/022035, dated Jul. 2, 2015, 7 pages.

International Preliminary Report on Patentability issued in International Application No. PCT/US2015/022035, dated Sep. 29, 2016, 6 pages.

Herr et al. "Ultra-Low-Power Superconductor Logic," arXiv1103.4269v1 , Mar. 22, 2011, 7 pages.

* cited by examiner

CHIPS INCLUDING CLASSICAL AND QUANTUM COMPUTING PROCESSORS

CROSS REFERENCE TO RELATED APPLICATION

This application claims the benefit, under 35 U.S.C. § 119(e), of U.S. Provisional Application No. 61/968,993, filed on Mar. 21, 2014, and which is hereby incorporated by reference in its entirety.

BACKGROUND

Artificial intelligence tasks can be translated into machine learning optimization problems. Some simplified tasks, such as feed forward problems, can be carried out by classical processors. Other complicated tasks, such as those involving NP-hard problems, can be performed using quantum hardware, e.g., a quantum processor. Typically, a quantum processor is constructed and programmed to encode the solution to a corresponding machine optimization problem into an energy spectrum of a many-body quantum Hamiltonian characterizing the quantum hardware. For example, the solution is encoded in the ground state of the Hamiltonian. Through an annealing process in which the Hamiltonian evolves from an initial Hamiltonian into a problem Hamiltonian, the energy spectrum or the ground state of the Hamiltonian for solving the problem can be obtained without diagonalizing the Hamiltonian.

SUMMARY

The present disclosure relates to chips that include both classical and quantum computing processors. In some implementations, the complicated tasks are performed using a combination of one or more classical processors and the quantum hardware. For example, the one or more classical processors determines parameters of the quantum Hamiltonian for programming the quantum hardware.

In general, an aspect of the disclosure covers an apparatus (or apparatuses) that include a substrate, a classical computing processor formed on the substrate, a quantum computing processor formed on the substrate, and one or more coupling components between the classical computing processor and the quantum computing processor, in which the one or more coupling components are arranged on the substrate and configured to allow data exchange between the classical computing processor and the quantum computing processor.

Implementations of the foregoing aspect can each optionally include one or more of the following features, alone or in combination. For example, in some implementations, the quantum computing processor is configured to receive output data from the classical computing processor and use the received output data as input data for a quantum computation to be carried out by the quantum computing processor. The quantum computing processor can be configured to be programmed using the output data.

In some implementations, the one or more coupling components connect an output port of the classical computing processor to an input port of the quantum computing processor.

In some implementations, the one or more coupling components connect an output of the quantum computing processor to an input of the classical computing processor.

In some implementations, each of the quantum computing processor and the classical computing processor includes a superconducting quantum interference device (SQUID).

In some implementations, each of the quantum computing processor and the classical computing processor includes at least one Josephson junction and an inductor.

In some implementations, the one or more coupling components include a superconducting wire.

In some implementations, the classical computing processor includes multiple quantum logic gates arranged according to Reciprocal Quantum Logic (RQL).

In some implementations, each of the quantum computing processor and the classical computing processor includes electronic components formed from a superconducting material. The superconducting material can include aluminum, niobium or a lead alloy.

Various implementations of the foregoing aspect may have one or more advantages. For example, in some implementations, combining classical computing processors and quantum computing processors on a single chip enables improvements in energy-efficiency of the overall system. By placing both the quantum and classical processor on a single chip that is cooled to temperatures applicable to achieve superconductivity within the classical processor's circuit components as well as the coupling components, the amount of heat dissipation through the classical processor circuit components and coupling components can be reduced. To assist with energy minimization, the same base material (e.g. Niobium or Aluminum) that is used for the quantum processor can be used for the electronic components of the classical processor, thus establishing a single critical temperature that is needed to achieve superconductivity. For example, for a classical processor employing Reciprocal Quantum Logic (RQL) based on quantum logic gates formed with superconducting Niobium, the overall energy efficiency of the classical processor (including the energy consumed by cooling) can be improved by factor of 100. Reciprocal Quantum Logic combines features of CMOS fabrication methodology (e.g., techniques such as micro and nano-lithography, photo-development, etching, lift-off, among others) with high speed and low-power signal levels achievable using Single-Flux Quantum signals, allowing for low static power dissipation, low latency and combinational logic.

The heat dissipation reduction can be theoretically estimated to lead to substantial savings in energy consumption of up to approximately eight orders of magnitude. This estimation is based on the energy-scale separation between existing CMOS semiconductors-based transistors with the fundamental Landauer limit of energy dissipation of computation that is allowable under the known laws of physics. Moreover, as the energy efficiency and consumption of classical processors operating above a superconducting critical temperature (e.g., CMOS-based) continues to increase with Moore's law, the increases in energy efficiency associated with classical processors operating on the same chip as the quantum processor become more desirable.

In some implementations, forming the classical processor on the same chip as the quantum processor, within the same dilution refrigerator system, enables non-trivial algorithmic advantages. Generally, for solving hard optimization and inference problems, there are different quantum and classical metaheuristic algorithms that can be explored. However, these approaches may be complementary and can be implemented on the same chip to provide improved solution accuracy, or a reduced time-to-solution given a fixed desired approximate solution. For example, thermal annealing and quantum annealing can be combined on the same chip. These computing paradigms can be complementary as quantum annealing can overcome tall and narrow energy barriers whereas thermal annealing can overcome shorter energy barriers. Generally, the output of a classical algorithm run by the classical processor (e.g., that employs thermal annealing) can be used as a seed to a quantum algorithm run by the quantum processor and the output of the quantum algorithm (e.g., that employs quantum annealing after measurement in computational basis) can be feed-forwarded to a classical algorithm for post-processing. This mechanism can be implemented iteratively and could lead to substantial improvements in computational speed, especially when the problem Hamiltonian has degenerate global energy with highly rigid local landscapes (e.g., with tall barriers that can utilize non-local features of quantum trajectories or quantum jumps).

In some implementations, combining the quantum and classical processors on the same chip can reduce the number of communication channels and control lines in and/or out of the combined chip. Moreover, placing classical and quantum processors on the same chip can reduce the distance between the processors. As a result, there may be associated increases in signal strength and/or improvement in the fidelity of state transfer. Additionally, in some implementations, the occurrence of decoherence of the quantum processor can be reduced. In the context of quantum annealing, this passive error-avoidance architecture is significant as there is not yet any known active error-correction strategy for such systems, in contrast to digital or gate-model quantum computing proposals.

The details of one or more embodiments of the subject matter of this specification are set forth in the accompanying drawings and the description below. Other features, aspects, and advantages of the subject matter will be apparent from the description, the drawings, and the claims.

DETAILED DESCRIPTION

Overview

Figure 1:
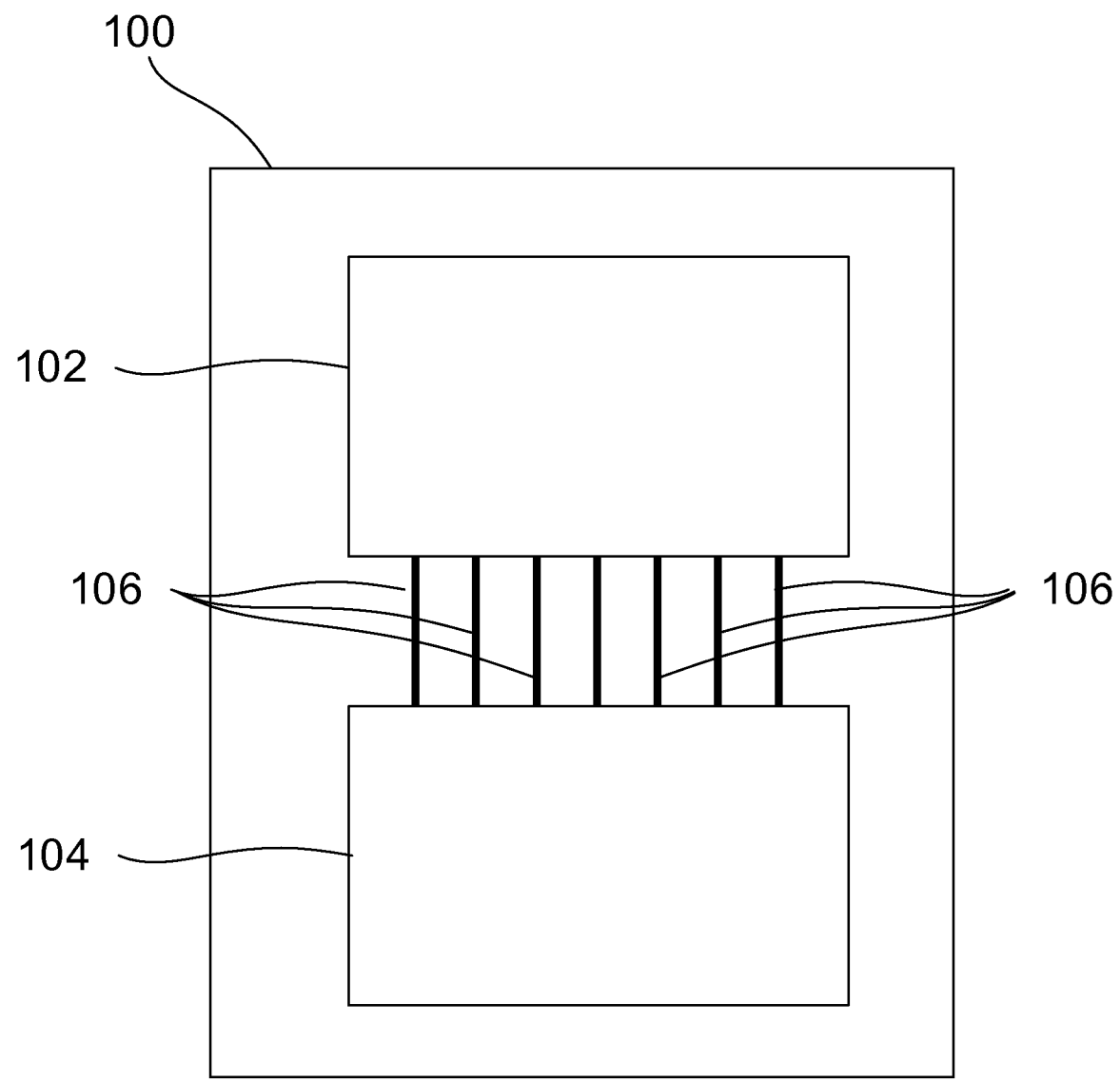
FIG. 1 is a schematic illustrating an example of a classical computing processor and a quantum computing processor formed on a single chip.

FIG. 1 is a schematic that illustrates an example of a single chip 100 on which is formed a classical computing processor 102 and a quantum computing processor 104. The classical computing processor 102 can exchange data with the quantum computing processor 104 through couplers 106.

Figure 2:
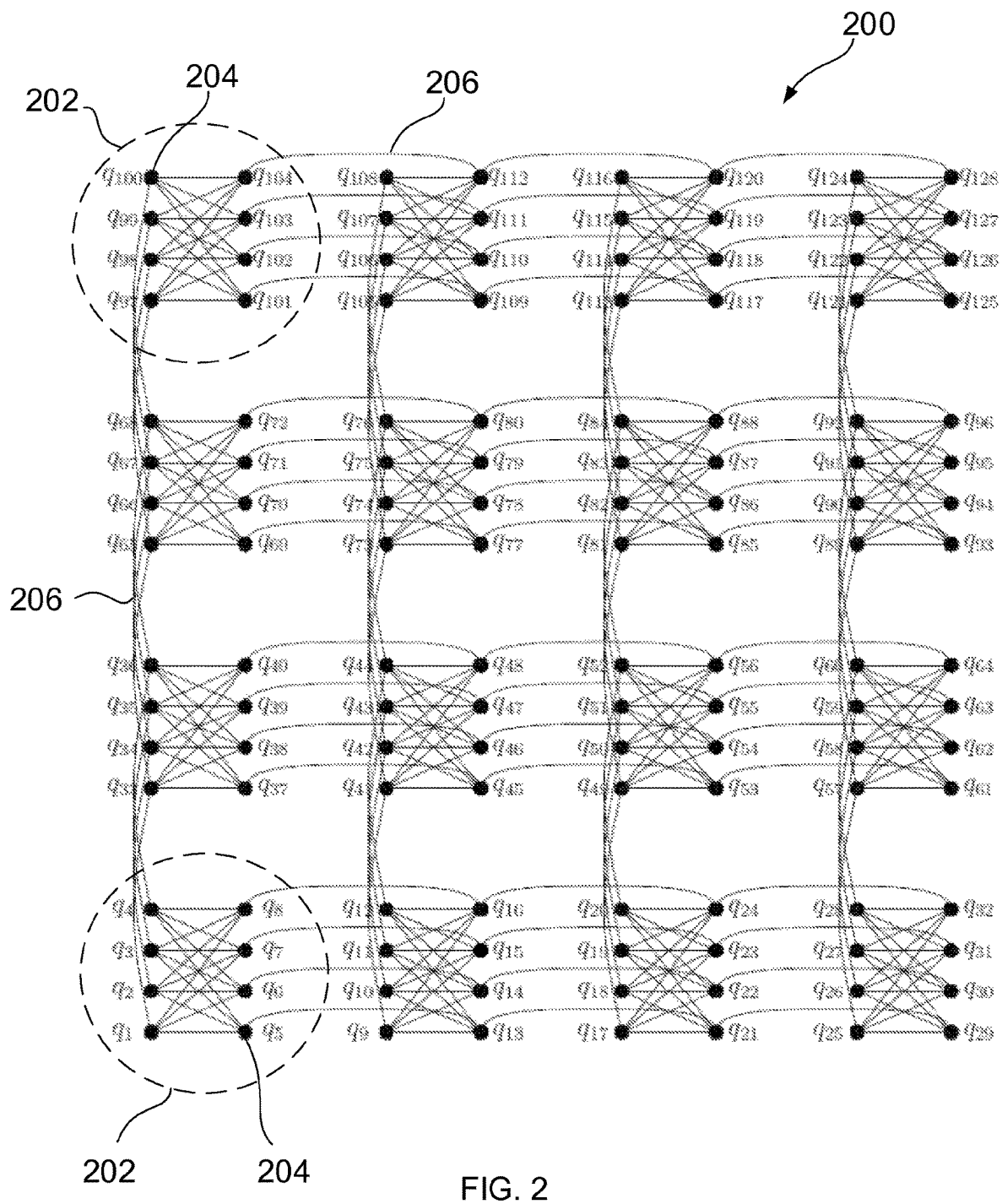
FIG. 2 is a schematic illustrating an example of a classical computing processor.

An example of the classical computing processor 102 arranged as a series of unit cells connected by couplers is shown in FIG. 2. The classical computing processor 102 may be configured to carry out instructions of a computer program by performing basic arithmetical, logical, and input/output operations on data, in which the data is represented in analog or digital form. The processor 102 may be constructed of active and passive electrical components that are configured, in part or as a whole, to execute a series of operations/tasks for manipulating one or more inputs to obtain one or more outputs, and achieve a desired end-result.

The quantum computing processor 104 may be configured to make use of quantum-mechanical phenomena, such as superposition and entanglement, to perform operations on data in a non-deterministic manner. In some implementations, the quantum computing processor 104 is configured to represent information in more than one state simultaneously (e.g., as qubits).

In use, the chip 100 can be used to perform tasks that are carried out only by the classical computing processor 102, tasks that are carried out only by the quantum computing processor 104, or tasks that are carried out by a combination of the classical computing processor 102 and the quantum computing processor 104. For example, the output of the classical computing processor 102 can be provided to the quantum computing processor 104 as input through the couplers 106. Alternatively, or in addition, the output of the quantum computing processor 104 can be provided to the classical computing processor 102 through the couplers 106. In some implementations, the chip 100 includes multiple classical computing processors 102 and/or multiple quantum computing processors 104, in which one or more classical computing processors 102 exchange data with one or more quantum computing processors 104 through couplers 106.

To operate the quantum computing processor 104, the components of the processor 104 can be driven with a transverse magnetic field to create quantum mechanical superposition and multi-qubit dissipative quantum tunneling in a given quantum annealing schedule. To operate the classical computer processor 102, the components of the processor 102 can be driven with zero or negligible transverse field that allows for dominating thermal excitation and implementation of a classical algorithm such as Simulated Annealing (SA), Metropolis-Hasting algorithm or Spin Vector Monte Carlo (SVMC). Although some quantum coherence might exist in one or more of the foregoing algorithms, e.g., in SVMC, this quantum coherence can be limited to an individual qubit.

By forming both the classical computing processor 102 and the quantum computing processor 104 on the same chip, certain benefits may be obtained. For instance, combining the classical computing processor 102 and the quantum computing processor 104 on a single chip may minimize energy consumption of the system as a whole. By placing both the quantum and classical processor on a single chip that is cooled to temperatures applicable to achieve superconductivity within the classical processor's circuit components as well as the coupling components, it is possible, in certain implementations, to reduce the amount of heat dissipation through the classical processor circuit components and coupling components. In some implementations, different elements of the classical computing processor 104 consume less power than equivalent device that operate at room temperature and also may generate less waste heat.

Moreover, the same fabrication techniques can be used to manufacture the quantum processor components and the classical processor components on the same substrate. For example, the same lithography, etching and deposition steps for building quantum annealing hardware, such as multi-qubit superconducting flux qubits, can be used for building the classical processor components, reducing the overall number of fabrication steps for the system.

Furthermore, since the classical computing processor 102 operates on the same cooled substrate as the quantum computing processor 104, no additional and separate cooling mechanism for the classical processor 102 may be required. Instead, the cooling process used to maintain the quantum processor 104 at its operating temperature (e.g., dilution refrigerator) can also be used to cool the classical processor 102.

In certain implementations, combining the classical processor 102 and the quantum processor 104 on a single chip also may improve the signal to noise ratio of data transferred between the two computing processors. By forming the classical processor 102 and the quantum processor 104 on the same chip, the distance over which the data travels between the two processors can be reduced, which may lead to a corresponding reduction in noise. In addition, in some implementations, one or more closed-loop quantum control mechanisms can be performed coherently on the chip with the appropriate feedback mechanism. Thus, there the number of classical control lines for coupling data into and/or out of the chip can be reduced. This reduction in classical control lines can suppress unwanted interactions of random environmental effects such as phononic and photonic radiation bath and systematic control errors that have a higher probability of occurring in the classical control lines.

As will be explained in the section entitled "Applications" in more detail below, the classical computing processor 102 may operate on data in combination with the quantum computing processor 104 to solve one or more problems. In certain implementations, the classical processor 102 is configured to output data that serves to initialize, or "seed" the quantum computing processor 104 (e.g., to initialize a Hamiltonian of the quantum processor 104). In certain implementations, the quantum processor 104 solves problems that are otherwise computationally intractable for the classical processor 102, where the output of the quantum processor 104 may be fed back to the classical processor 102.

Classical Computing Processor

FIG. 2 is a schematic illustrating an example of a classical computing processor 200, such as the processor 102 shown in FIG. 1, in which the processor 200 is formed on the same chip as a quantum computing processor. In some implementations, the classical computing processor 200 is constructed using superconducting materials.

The classical computing processor 200 includes 4 by 4 unit cells 202 of eight electronic components 204, in which each active component 204 is capable of generating a binary bit (e.g., 1 or 0, −1 or +1). The bits generated by components 204 are connected by inductive couplers as shown by lines 206. Each line 206 may represent one or multiple couplers between a pair of bits. The bits produced by components 204 and the couplers 206 can be thought of as the vertices and edges, respectively, of a "Chimera" graph with a bipartite structure. The processor 200 can also include a larger number of unit cells 202, e.g., 8 by 8 or more.

The components and classical operation of the processor 200 can be designed according to Reciprocal Quantum Logic (RQL). RQL is a logic family that combines low energy and high clock rates of superconductor devices with qualities of CMOS technology, including low static power dissipation and low latency combinational logic. Unlike transistor circuits, where dissipated power is set by device size and materials, the superconductor circuits used in RQL have a device size and power dissipation set by the thermal noise limit. The active device selected for use in RQL is a Josephson junction that generates quantum accurate digital information in the form of Single Flux Quanta (SFQ). The SFQ can exist as a transient voltage pulse across the Josephson junction or as a persistent current in a superconducting inductive loop. Various high speed processors have been constructed using SFQ including, for example, a static digital divider that operates up to 770 GHz, a digital signal processor operating between 20-40 GHz, and a serial microprocessor operating at 20 GHz. In previous superconductor circuits, DC power was delivered on a common voltage rail via bias resistors, analogous to TTL logic, which lead to parasitic heat and increased latency. RQL is able to reduce the parasitic heat and latencies by replacing bias resistors with inductive coupling to an AC transmission line. Furthermore, RQL encodes data (e.g., a logical "1") as a reciprocal pair of SFQ pulses of opposite polarity. During the positive polarity, the logic operation involves storage and routing of SFQ data pulses. The trailing negative polarity pulse acts as a reset.

Alternatively, the active components 204 of the classical processor 200 can be built using the same superconducting electronic components (e.g., SQUID devices, see below) of the quantum processor, in which the dynamics of each component is driven to a classical limit (e.g., by eliminating the transverse magnetic field at a finite temperature of the overall unit). In this case, the classical processor is a probabilistic analog device that could implement probabilistic inference and optimization algorithm such as belief propagation, simulated annealing, spin-vector Monte Carlo.

The components of the classical processor may be formed of the same material (e.g., superconducting metals such as aluminum, niobium, lead alloys, or other applicable metals) used to form the quantum processor on the chip. For example, the classical computing processor can be formed using multiple layers of a superconducting metal such as Niobium, deposited on a substrate (e.g., Si) where different components (e.g., coupling inductors, Josephson junctions, bias inductors, clock lines) are formed in one or more layers using standard micro and nano-lithography techniques. A Josephson junction can be formed, for example, by separating the superconductor metal with a thin insulating barrier (e.g., with an oxide insulator such as aluminum oxide or niobium oxide) or a short section of non-superconducting metal. A bit shift register can be fabricated, for example, with 1600 Josephson junctions in a commercial superconductor fabrication process with 4.5 kA cm$^{-2}$ Josephson junction critical current density, 1.5 μm minimum feature size, and four metal layers.

Quantum Computing Processor

Figure 3:
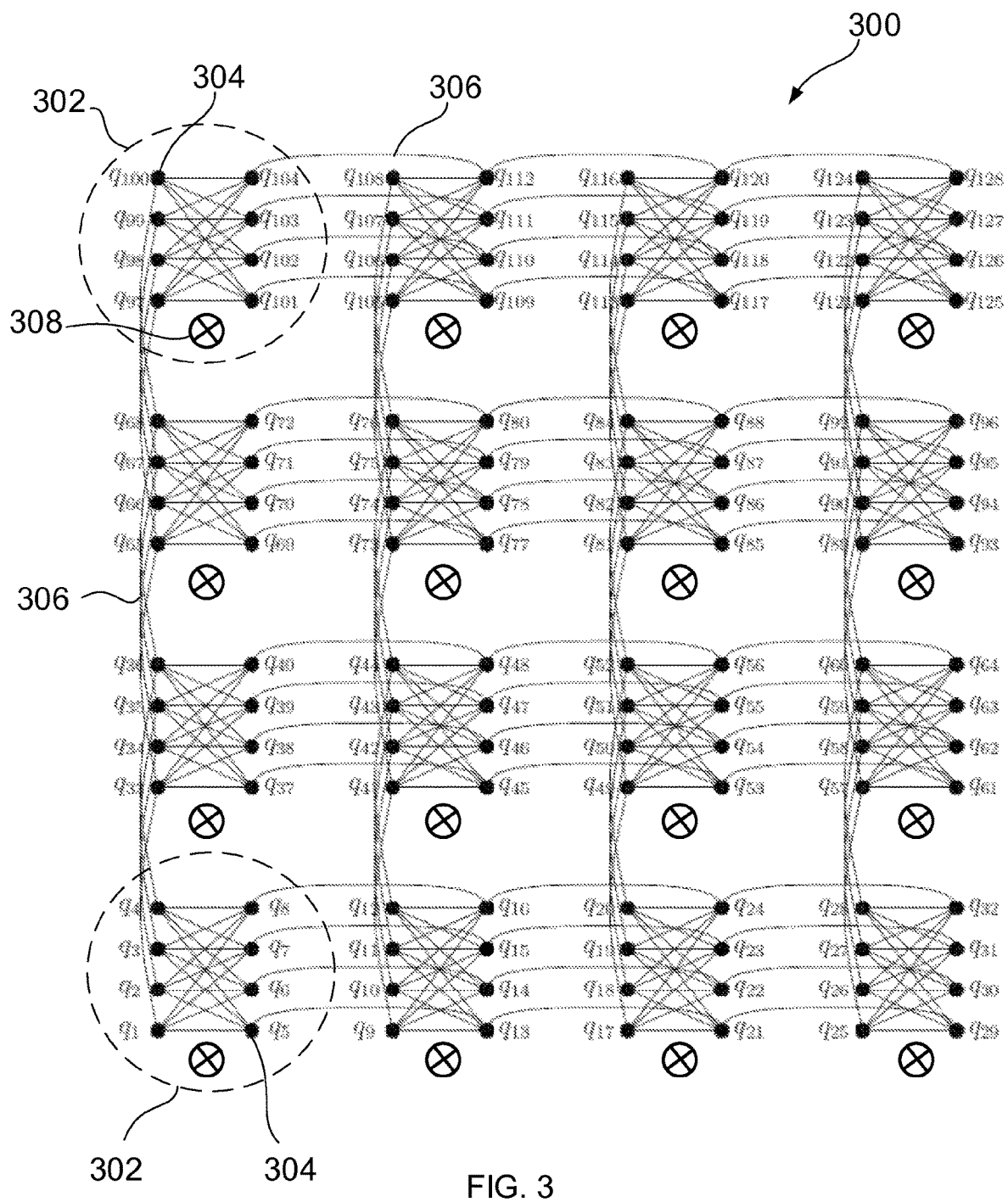
FIG. 3 is a schematic illustrating an example of a quantum computing processor.

FIG. 3 is a schematic illustrating an example of a quantum computing processor 300, such as the processor 104 shown in FIG. 1, in which the processor 300 is formed on the same chip as a classical computing processor. The processor 300 may include any suitable quantum computing system such as, for example, a superconducting adiabatic quantum computing (AQC) systems Similar to the classical computing processor shown in FIG. 2, the quantum processor 300 includes 4 by 4 unit cells 302 of eight components 304 that are operable to generate qubits. Programmable inductive couplers 306, shown by lines in FIG. 3, connect different qubits within a unit cell and across different unit cells. Each line 306 can correspond to one or multiple couplers between a pair of qubits. The processor 300 can also include a larger number of unit cells 302, e.g., 8 by 8 or more. The qubits produced by components 304 and the couplers 306 can be thought of as the vertices and edges, respectively, of a "Chimera" graph with a bipartite structure.

In general, the components 304 of the quantum computing processor 300 can be constructed from superconducting electronic circuits (e.g., superconducting quantum interference devices (SQUIDs)). The superconducting electronic circuits a quantum computing processor are operated at very low temperatures, such as on the order of 1 K or less, so that superconductivity is realized for the selected superconducting material, and thermal fluctuations do not cause transitions between energy levels. SQUIDs can be formed from at least one metal (e.g., Niobium, Aluminum, or a lead alloy), in which the SQUID operates below the metal's corresponding critical temperature threshold for superconductivity. A typical implementation of a SQUID includes a ring of superconductor metal interrupted by one or more Josephson junctions or capacitors. As explained, a Josephson junction can be formed, for example, by separating the superconductor metal with a thin insulating barrier (e.g., with an oxide insulator such as aluminum oxide) or a short section of non-superconducting metal. Under certain conditions, electric charge may pass through the Josephson junction of the SQUID through the process of quantum tunneling. The information in a SQUID can be encoded, for example, as an electric charge, a phase or flux (e.g., as a result of combinatory possibilities of cooper-pairs current in various superconducting islands). The state of various SQUIDs can be quantum-mechanically entangled by either inductive couplings, capacitor couplings, or Cavity quantum electrodynamics (QED) transmission lines. The measurement of quantum state and dynamics of qubits can be performed by entangling the state of each SQUID with photonic excitations in one or several transmission lines, in which the photonic excitations are injected electronically.

As with the classical processor, the quantum processor can be formed using multiple layers of a superconducting metal such as Niobium, deposited on a substrate (e.g., Si) where different components of the processor (e.g., coupling inductors and Josephson junctions) are formed in one or more layers using standard micro and nano-lithography techniques.

A difference between the operation of the classical processor 200 and the quantum processor 300 is that the components of the processor 304 of the quantum processor are driven with a transverse magnetic field 308 represented by the symbol ⊗ to create quantum mechanical superposition and multi-qubit dissipative quantum tunneling in a given quantum annealing schedule. To operate the classical computer processor 200, the components 204 are driven with zero or negligible transverse field that allows for dominating thermal excitation and implementation of a classical algorithm. Thus, unlike in the quantum processor, quantum tunneling cannot occur in the components of the classical processor.

Figure 4A:
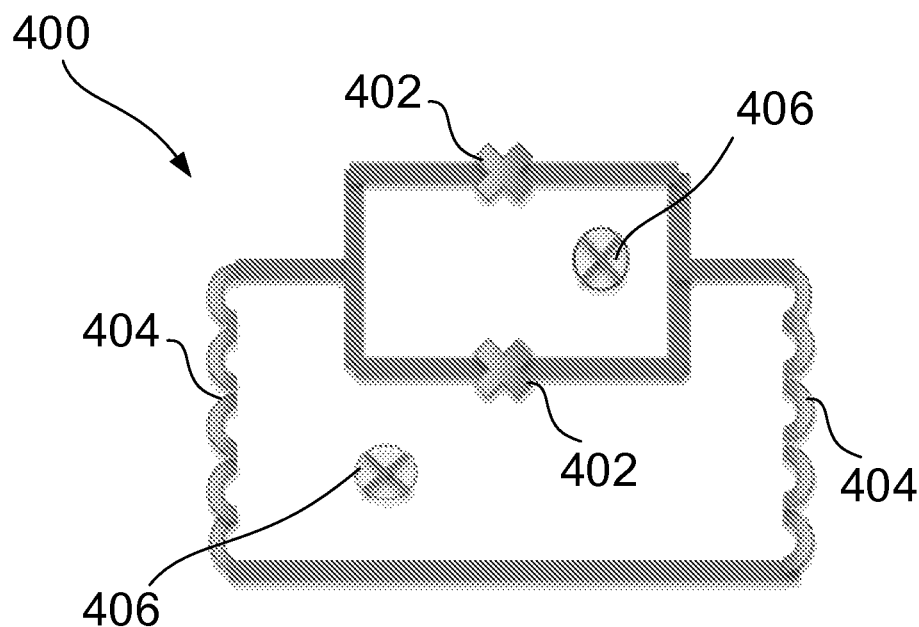
FIG. 4A is a schematic that illustrates an example of a component of a quantum computing processor for producing a superconducting flux cubit.

FIG. 4A is a schematic that illustrates an example of a component 400 of a quantum computing processor for producing a superconducting flux cubit. In the example of FIG. 4A, each component 400 is a superconducting qubit and includes two parallel connected Josephon boxes 402. Each Josephson box 402 can include a Josephson junction connected in parallel with a capacitor (not shown). The parallel connected Josephson boxes 402 are both coupled to one or more inductors 404. During operation of the component 400, a transverse magnetic field is applied to the Josephson boxes 402 to create quantum mechanical superposition and multi-qubit dissipative quantum tunneling in a given quantum annealing schedule.

Figure 4B:
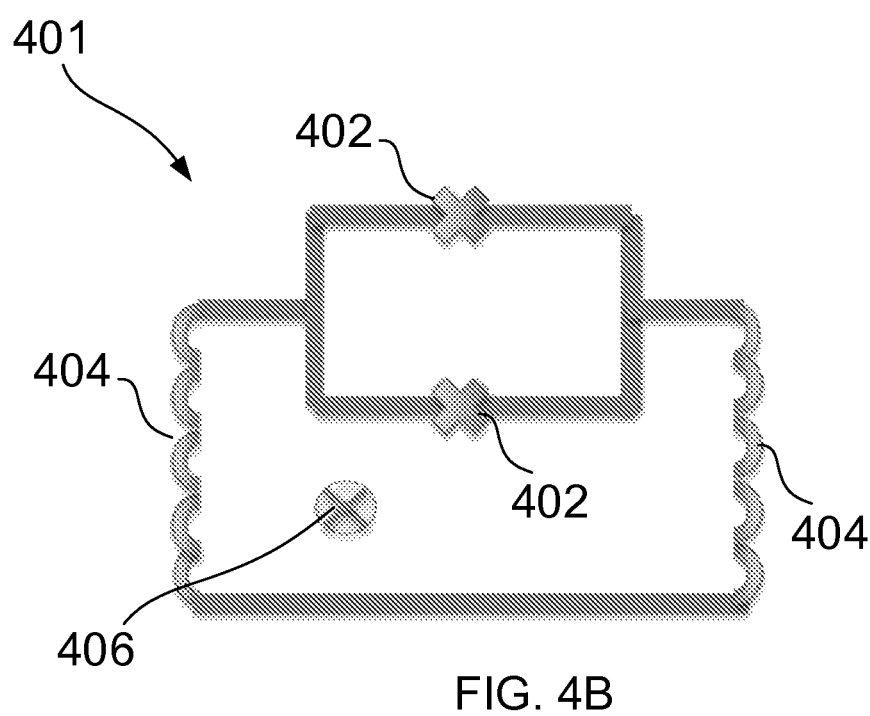
FIG. 4B is a schematic that illustrates an example of a component of a classical computing processor for producing a superconducting flux bit.

FIG. 4B is a schematic that illustrates an example of a component 401 of a classical computing processor for producing a superconducting flux bit. The structure of the component 401 is essentially identical to the component 400 of the quantum processor. That is, it includes two Josephson boxes 402 (formed from a Josephson junction coupled in parallel to a capacitor (not shown)) in parallel that are both coupled to one or more inductors 404. However, there is no transverse magnetic field 406 applied to the Josephson boxes. As a result, the device can continue to operate in the classical regime, without quantum mechanical superpositioning or quantum mechanical tunneling. As shown in FIG. 4B, a transverse magnetic field can still be applied to transfer data to and from the inductor(s) 404.

Figure 5:
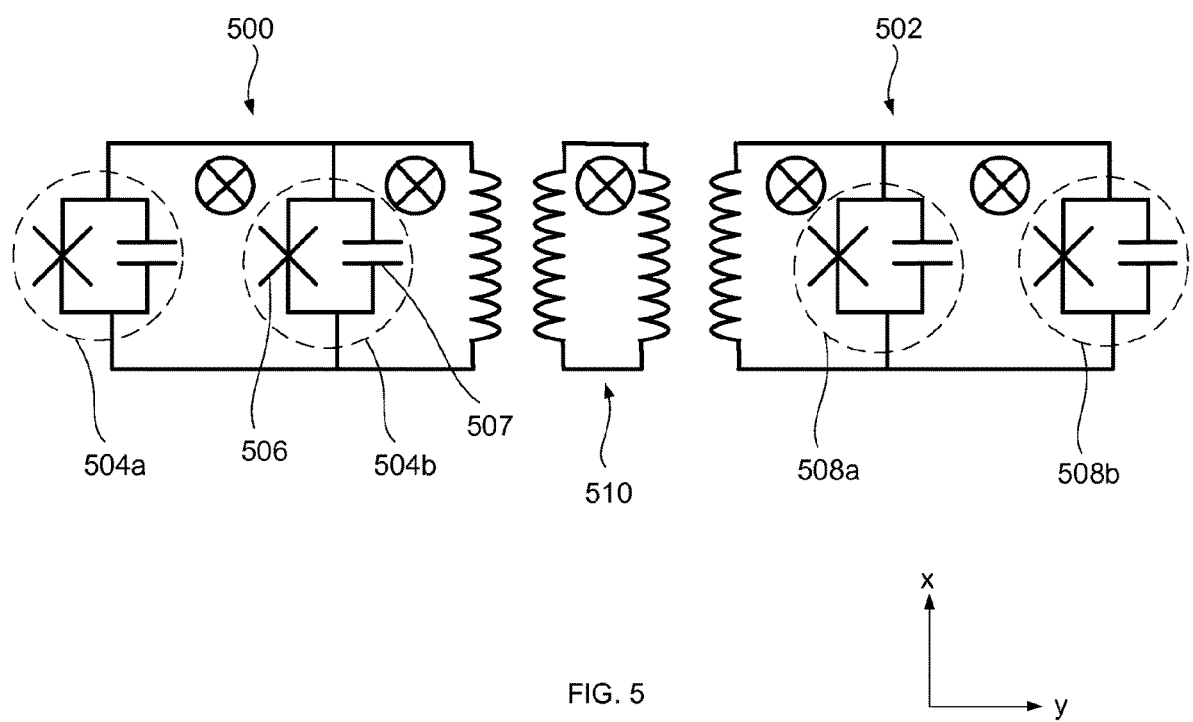
FIG. 5 is a schematic that illustrates an example of a pair of coupled qubits in the same unit cell of a chip.

As shown in FIGS. 2 and 3, the nodes of a unit cell can be coupled to one another or to nodes in other unit cells of the same processor. FIG. 5 is a schematic that illustrates an example of a pair of coupled qubits 500, 502 in the same unit cell of a quantum computing processor. In this example, each qubit is a superconducting qubit and includes two parallel connected Josephson boxes 504a, 504b or 508a, 508b. Each Josephson box can include a Josephson junction 506 connected in parallel to a capacitor 507. Though each superconducting qubit is shown in FIG. 5 as having parallel connected Josephson boxes 504a, other arrangements are also possible. For example, in some implementations, a single Josephson box can be used. During operation, the qubits 500, 502 are subject to an external transverse magnetic field B applied along a z direction perpendicular to the surface of the paper on which the figure is shown to give rise to the desired quantum effect (e.g., superposition); the B field is labeled by the symbol ⊗. A set of inductive couplers 510 is placed between the qubits 500, 502 such that the qubits are coupled along the z-z directions in the space spanned by the operator basis (Pauli operators). The same arrangement shown in FIG. 5 can be used for a classical processor as well, with the exception that a transverse magnetic field is not applied to the nodes 500, 502 so that undesired quantum effects, such as superpositioning and quantum tunneling do not occur. The Hamiltonian of the quantum processor can be written as:

$$H_{SG} = I(t)\sum_i^N \sigma_i^x + P(t)\left(-\sum_i^N h_i\sigma_i^z + \sum_i^N J_{ij}\sigma_i^z\sigma_j^z\right)$$

where $\sigma_i^x$ and $\sigma_i^z$ are binary and each represents the spin of the $i^{th}$ qubit along the x direction or the z direction, respectively. $h_i$ and $J_{ij}$ are parameters that can be programmed for different problems to be solved by adjusting the inductive coupler set 508. $h_i$ and $J_{ij}$ have real values. N is the total number of logical qubits for computation. The sparsity of the parameter $J_{ij}$ is constrained by the hardware connectivity, i.e., the connectivity of the qubits shown in FIG. 5. For unconnected qubits, the corresponding $J_{ij}$ is 0. I(t) and P(t) represent the time-dependency of initial and problem Hamiltonians, respectively. In a simplified example, I(t) equals (1−s), and P(t) equals s, where s equals $t/t_T$, and $t_T$ is the total time for the annealing process.

In some implementations, the quantum computing processor performs universal adiabatic quantum computations without being limited by 2-local stochastic Hamiltonians and can perform arbitrary or universal quantum operations in the adiabatic regime.

Coupling Between Processors

The classical computing processor that is arranged on the same chip as the quantum computing processor can be configured to exchange data with the quantum computing processor by coupling the input and/or output of the active components of the classical processor to the input and/or output of the active components of the quantum processor. Based on particular architecture and the particular encoding employed the classical processor, the processors can exchange information directly, e.g., by coupling superconducting flux bits to superconducting flux qubits. Or, after a quantum processor has evolved to a ground state of an optimization problem, the resulting classical bits produced in the quantum processor by solving the optimization problem can be directly coupled to the classical processor. For example, at the end of a query of a quantum oracle (associated with the time-scale that the quantum processor requires to approach equilibrium), the state of one or more qubits from the quantum processor are projected to the classical computational basis. The output density operator of quantum processor is diagonal, which represents the classical mixture of computational basis capturing the statistical properties of quantum inference or quantum optimization protocol. The information can be transferred from the quantum processor to the classical processor through inductive coupling or via SWAP gates, with potential usage of repeaters to improve the fidelity of states. For instance, a 2-input/2-output SWAP gate simply exchanges the bit values it is provided. Using the information provided by the quantum processor, the classical processor then starts with the quantum-mechanically prepared ansatz and completes the computation fully classically. Direct coupling is possible, e.g., when there is a homogenous superconducting flux qubit/bit design throughout the chip (in both quantum and classical units), such as shown in FIGS. 4A-4B.

Figure 6:
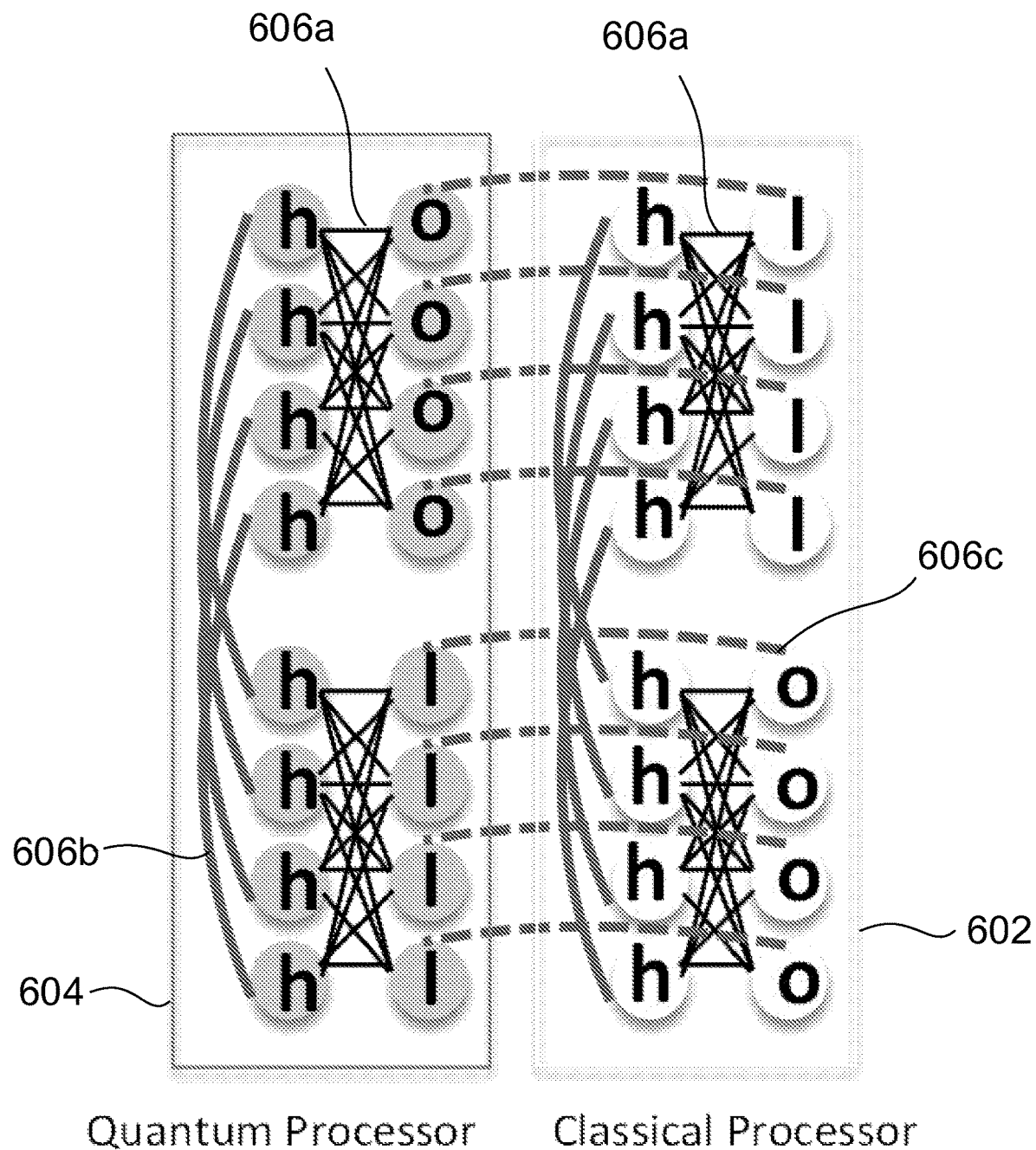
FIG. 6 is a schematic that illustrates an example of a quantum computing processor directly coupled to classical computing processor on a same chip.

FIG. 6 is a schematic that illustrates direct coupling between a quantum computing processor 604 and a classical computing processor 602. In this example, each processor includes 16 physical bits/qubits on two unit cells of 8 qubit/bit per unit within a Chimera graph. However, there are only four hidden and four input or output qubits/bits (denoted by "h," "I," and "O" respectively) within each unit cell. There are no interactions among hidden qubits/bits or among data (input or output) qubits/bits in each unit cell. The intra-cell coupling 606a between hidden qubits/bits and data qubits/bits within a restricted layer will depend on the selected problem Hamiltonian). The coupling 606b represents mutual inductive coupling between hidden nodes of different unit cells. The coupling 606b is set to be ferromagnetic (+1) and simply copies the hidden nodes from one unit cell to another unit cell. The dashed line coupling 606c represent direct mutual inductive coupling between data nodes (input or output) of the quantum and classical processors. Coupling 606c becomes active at the end of or prior to the beginning of one or more iterations of the quantum processor to transfer data between the classical and quantum processors. The coupling 606c is during the computation phase of the quantum processor. Coupling 606c can be activated, for example, through the application of an appropriate external current to inductive couplers between the quantum and classical processors. Deactivation of the coupling 606c can be accomplished, for example, by withdrawing the external current from the inductive couplers between the quantum and classical processors.

Alternatively, the processors can exchange information indirectly, e.g., where post-measurement processing is performed between transmission of data between the quantum and classical processor. In other words, the output of classical and quantum processors is post-processed at the end of each phase of computation and before being transferred to the other processor core.

Figure 7:
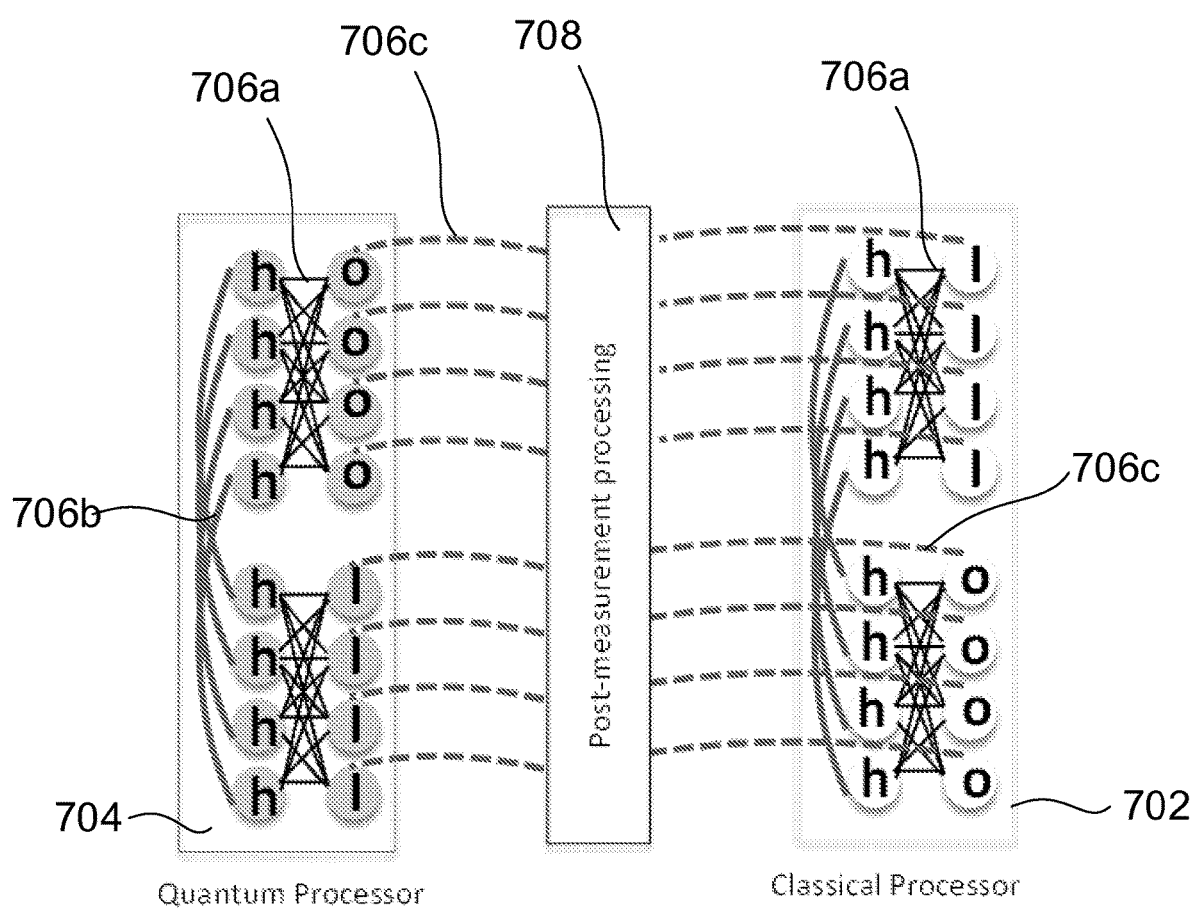
FIG. 7 is a schematic that illustrates an example of a quantum computing processor indirectly coupled to classical computing processor on a same chip.

FIG. 7 is a schematic that illustrates indirect coupling between a quantum computing processor 704 and a classical computing processor 702. In this example, the arrangement of the processors is identical to the arrangement shown in FIG. 6. That is, each processor includes 16 physical bits/qubits on two unit cells of 8 qubit/bit per unit within a Chimera graph. However, there are only four hidden and four input or output qubits/bits (denoted by "h," "I," and "O" respectively) within each unit cell. There are no interactions among hidden qubits/bits or among data (input or output) qubits/bits in each unit cell. The intra-cell coupling 706a between hidden qubits/bits and data qubits/bits within a restricted layer can be arbitrary (e.g., it depends on a given problem). The coupling 706b represents mutual inductive coupling between hidden nodes of different unit cells. The coupling 706b is set to be ferromagnetic (+1) and simply copies the hidden nodes from one unit cell to another unit cell.

In contrast to the arrangement of FIG. 6, the dashed line coupling 706c represent indirect mutual inductive coupling between data nodes (input or output) of the quantum and classical processors. Coupling 706c still becomes active at the end of one or more iterations of the quantum processor (or at the end of one or more iterations of the classical processor) to transfer data between the classical and quantum processors, but the data being transferred now is modified by one or more processing elements 708, that can perform various data processing and analysis tasks, such as Bayesian analysis, signal amplification and/or error-correction. These tasks can be might be perform with additional superconducting components or CMOS-based processors. As before, coupling 706c can be activated, for example, through the application of an appropriate external current to inductive couplers between the quantum and classical processors. Deactivation of the coupling 706c can be accomplished, for example, by withdrawing the external current from the inductive couplers between the quantum and classical processors.

Figure 8A:
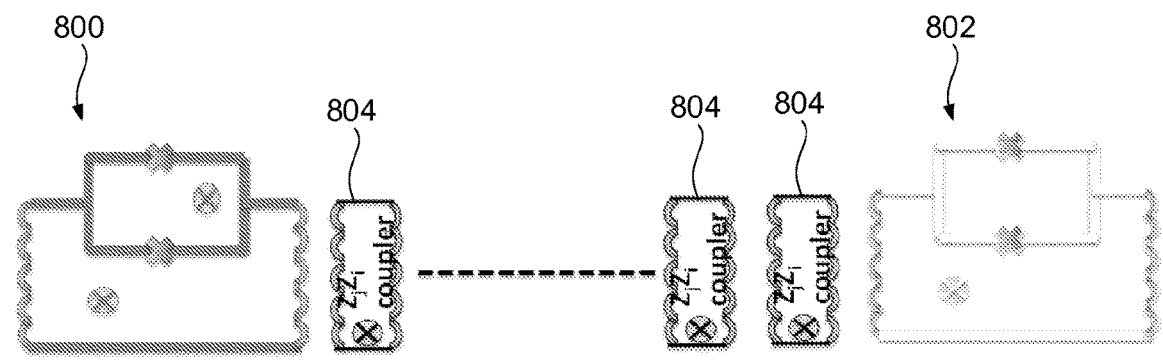
FIG. 8A is a schematic illustrating an example of direct coupling between an input or output of a quantum computing processor and an input or output of a classical computing processor.

FIG. 8A is a schematic illustrating an example of direct coupling between a component 800 of a cell of a quantum computing processor and a component 802 of a classical computing processor. As shown in the schematic, direct coupling is achieved through the use of mutual inductance through multiple inductive couplers 804 that are formed on the same chip as the quantum and classical processors. For instance, as a transverse magnetic field is applied to the couplers 804, the data from the inductor of the component 800 (output qubit) is transferred to the inductor of the component 802 (input bit). Alternatively, the data from the inductor of the component 802 (output bit) is transferred to the inductor of the component 802 (input qubit).

Figure 8B:
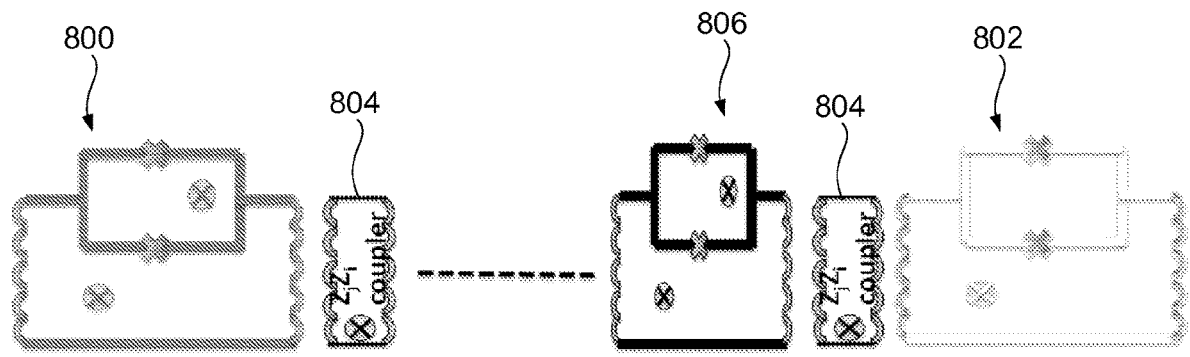
FIG. 8B is a schematic illustrating an example of indirect coupling between an input or output of a quantum computing processor and an input or output of a classical computing processor.

FIG. 8B is a schematic illustrating an example of indirect coupling between a component 800 of a cell of a quantum computing processor and a component 802 of a classical computing processor. Post-processing can include processing on additional bits/qubits at sub-Kelvin temperature or through traditional (e.g., CMOS-based) classical processors at that are operating at the room temperature.

Fabrication

An example process for fabricating the classical and quantum processors on a same chip is set forth as follows. In a first step, a substrate (e.g., single crystal Si wafer) is provided. In some implementations, the surface of the substrate can be oxidized to provide an insulating barrier. Then, using conventional micro- or nano-lithography techniques, the layers of superconducting material are deposited and patterned on the substrate surface. For instance, a photoresist layer may be deposited and patterned first followed by deposition of the superconducting metals, after which a lift-off step is performed. Alternatively, or in addition, the superconducting metal may be deposited and patterned using etching techniques (e.g., wet chemical etching). Oxides of the metals can be formed through standard techniques including for example, local oxidation of the superconducting metal. The patterning of the deposited metal and oxides can be designed to form the classical and quantum active and passive components, such as the Josephson junctions, capacitors and inductors, as well as the coupling connections between the processors. Once fabricated, the devices can be operated at temperatures corresponding to the superconducting temperatures for the metals selected (e.g., less than 1 K) using, e.g., a dilution refrigerator.

Applications

As explained above, the classical computing processor 102 of the chip 100 can operate on data in combination with the quantum computing processor 104 to solve one or more problems. As noted, at the end of a query of a quantum oracle, the state of qubits can be transferred to the classical processor. However, the classical processor could also return its output to the quantum solver as a new local initialization for another phase of quantum computation. The process can be done iteratively to converge to a steady state of overall dynamics assuming the overall dynamics of quantum and classical Markov chain is ergodic with a unique attracting state. The mixing time of the overall process could be shorter than fully quantum or fully classical algorithm for the same task.

For example, a classical bit string can be obtained by measuring populations of superconducting flux qubits of a quantum processor operating as a quantum annealer. A quantum annealer determines solutions to hard optimization problems by evolving a known initial configuration towards a ground state of a Hamiltonian that encodes an optimization problem. The state of the quantum devices within the processor evolve according to the laws of quantum mechanics and updates all variables simultaneously. To perform quantum annealing or adiabatic quantum optimization, the variable of a model can be mapped to the z-component of a quantum spin-half variable (qubit). A transverse magnetic field then is applied to induce quantum fluctuations, thus obtaining a time-dependent Hamiltonian. Quantum annealing at finite temperature T starts in the limit of a strong transverse field and weak couplings. Decreasing the strength of the transverse field increases the couplings and allows the system to evolve towards the ground state of the optimization problem. The output states of the quantum annealer then can be fed into thermal/classical annealer (which has the same superconducting flux components but operating in their corresponding classical limit, e.g., without application of the transverse magnetic field). The output of classical processor (which would be another bit string correspond to combinatory values of bits being either 0 or 1) can be fed back into quantum annealer as a seed solution. The above strategy can provide a better time-to-solution with a given desired residual energy (accuracy of solution) than fully quantum or fully classical strategies. In addition, the combined provides better energy efficiency and robustness by performing both classical and quantum computation at a superconducting phase at the same sub-Kelvin temperature scale.

Figure 9:
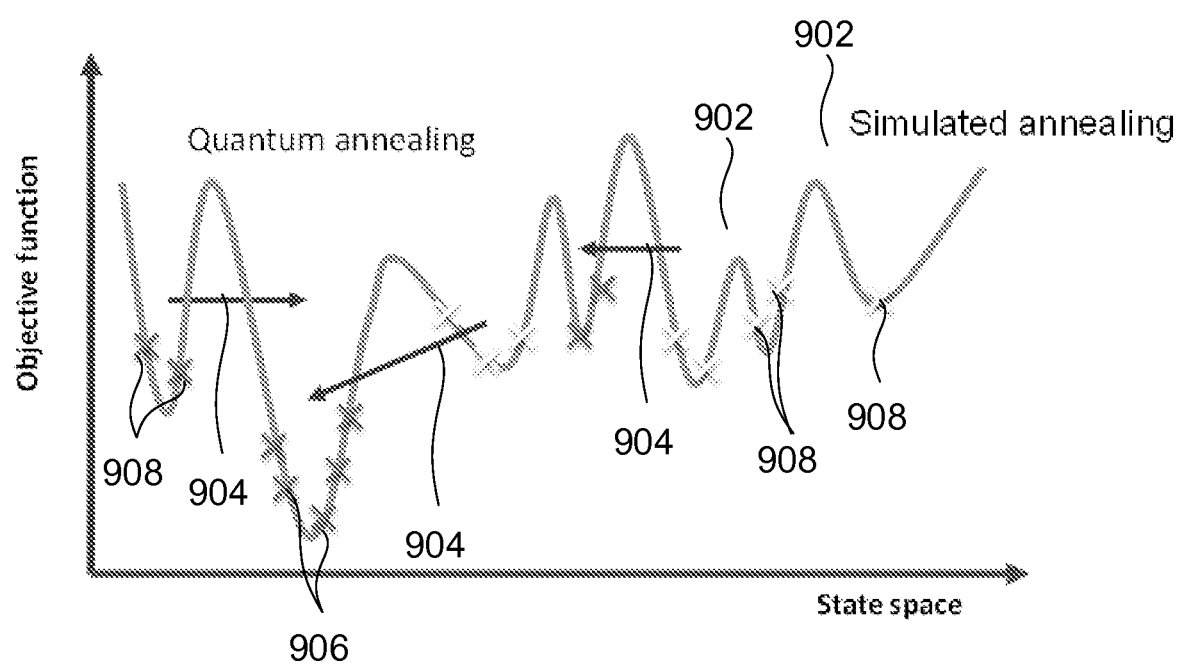
FIG. 9 is a graphical representation of an example of a feed-forward neural network model.

FIG. 9 is a plot that shows a generic example of a non-convex objective function versus state space, in which quantum and classical processors on a combined chip can perform mixed quantum annealing and simulated annealing to obtain the desired residual energy. Classical simulated annealing performs well when thermal jumps/hops occur over short energy barrier (arrows 902). However quantum annealing performs better when energy barrier are tall and narrow such that tunneling can occur (arrows 904). The combined chip can perform better than either of quantum or classical processors alone to sample the objective function that exhibits both tall-narrow energy barriers as well as short energy barriers. This is evident by complementary nature of quantum and classical computational events here denoted by cross hairs, in which cross hair corresponds to an output bit string of a quantum (906) or classical (908) processor. Using both classical and quantum operations, the system can quickly reach the desired residual energy and a more accurate solution (e.g., global minimum of the objective function as opposed to a less accurate local minimum). In this method, one should be careful to adjust the strength of external/driving field (e.g., the transverse magnetic field used in quantum annealing) such that the many-body quantum systems does not experience a first or second order phase transition, which otherwise could lead to an effective resetting of the computation.

In another example, the classical and quantum processors may be configured to implement a model, such as an artificial neural network model. Artificial neural networks are useful systems for solving complex problems (e.g., machine learning problems such as classification problems, pattern matching problems, image recognition problems, speech recognition problems, voice recognition problems, or object recognition problems), in which the network represents a trained model, e.g., a trained undirected graphical model. The model is trained by inputting training data to the model, i.e., initial model parameters are determined from training data. The refinement of the model parameters may occur as additional data, whether training data or observable data, is fed into the model. Certain steps in the training of the model or when using the model for predictions may be performed using the quantum computing processor 104. Alternatively, or in addition, the classical computing processor 102 may implement the model and provide an output of the model to the quantum computing processor 104 to address a separate problem for which the quantum computing processor is designed.

Figure 10:
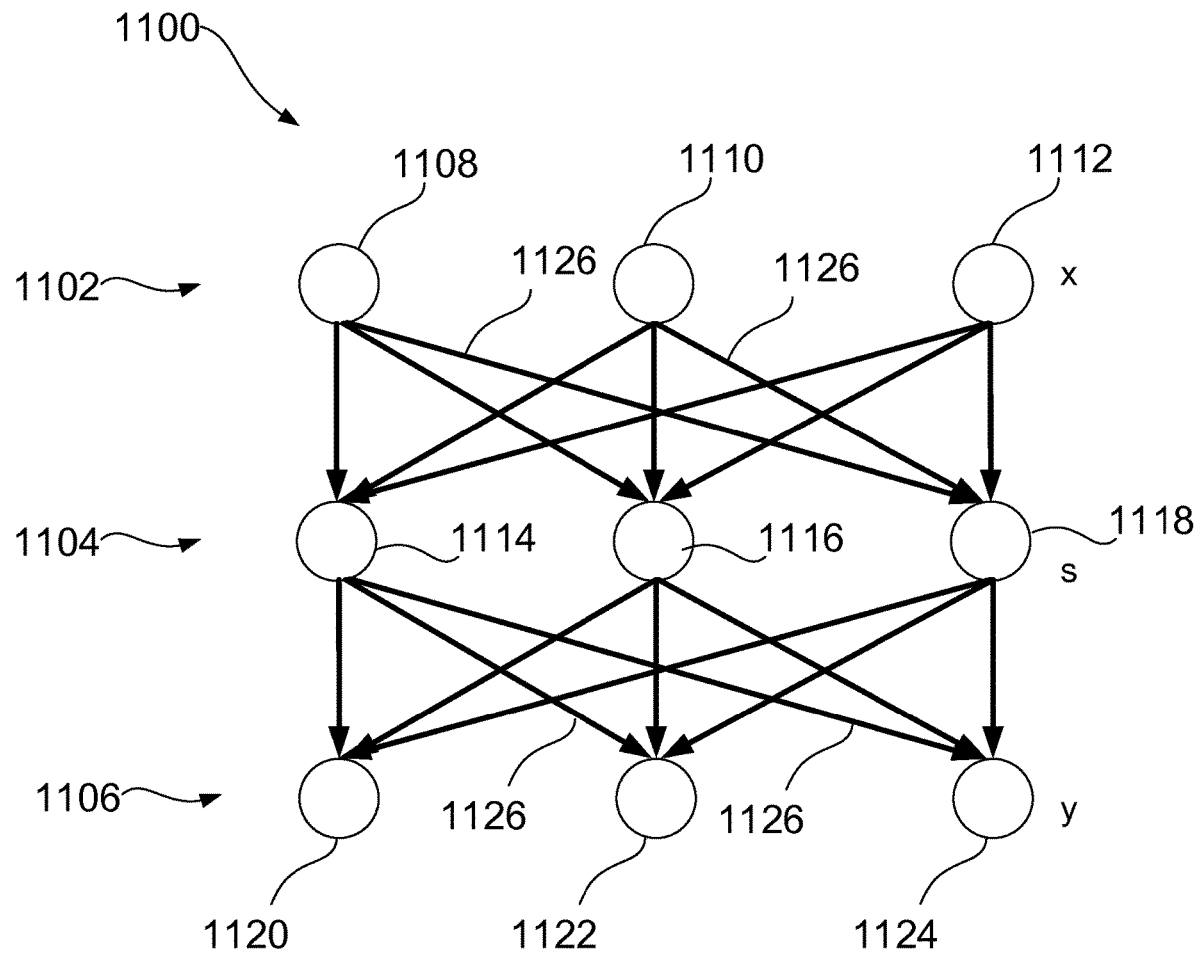
FIG. 10 is a plot of an objective function versus state space.

FIG. 10 is a graphical representation of an example feed-forward neural network model 1100. A feed-forward neural network model is a basic type of artificial neural network model in which information always moves in one direction. The network model 1100 is represented as a network of nodes 1108, 1110, 1112, 1114, 1116, 1118, 1120, 1122, 1124 arranged in layers, 1102, 1104, and 1106, where information moves from input layer 1102 to output layer 1106. Each node is connected with at least one other node through a connection 1126. Each node is also defined with an energy and is stochastic, whereas each connection 1120 can be a parameter that represents the connection strength between the two nodes. The nodes within the same layer do not interact with each other, and the nodes within different layers interact with each other.

The layers may be visible or invisible. A visible layer is one which receives input data from or provides output data to a source external to the model, whereas an invisible layer receives input from or provides output to another layer in the model. The variables in the visible layers 1102, 1106 are denoted as x, y, respectively. In building the model, the variables x are the input, which will receive observed data, after the model is trained, and the variables y are the output. The variables in the hidden layer are labeled as s. In the example shown in the figure, the hidden nodes have interactions with each other and the visible nodes have interactions among themselves.

During training of a neural network model, such as model 1100, parameters of the model are determined with the goal that the trained model optimally fits the observed data from any of the problems to be solved. Part of or the entire training of the model can be computationally intractable, depending on the size or complexity of the model, or both. For example, the time the model must be trained in order to collect equilibrium statistics can grow exponentially with the size (e.g., number of parameters or units in a network) of the model. In such cases, a quantum computing processor can be used to train the model, such as model 1100, and provide the solution as an output at layer 1106. The output at layer 1106 then can be coupled to the classical processor for further processing of the results. Alternatively, the classical processor can provide a classical input as a "seed" to layer 1102 of the model 1100, where the quantum processor subsequently trains the seeded model.

As described herein, the quantum and classical computing processors require ultra-cold operating temperature to allow certain materials within the processors to achieve superconductivity. The ultra-cold temperatures can be provided by a cryogenic refrigeration subsystem. Various systems and methods exist for producing and sustaining cryogenic temperatures. Examples of such systems include liquid cryogenic baths (e.g., liquid nitrogen or liquid helium), Stirling cryocoolers, Joule-Thomson cryocoolers, adsorption refrigerators, dilution refrigerators, adiabatic demagnetization refrigerators, among others.

Magnetic fields produced by external sources may cause unwanted interactions with devices in the integrated circuit. Accordingly, superconducting shielding can be provided to reduce the strength of interference such as magnetic and electrical fields.

Figure 11:
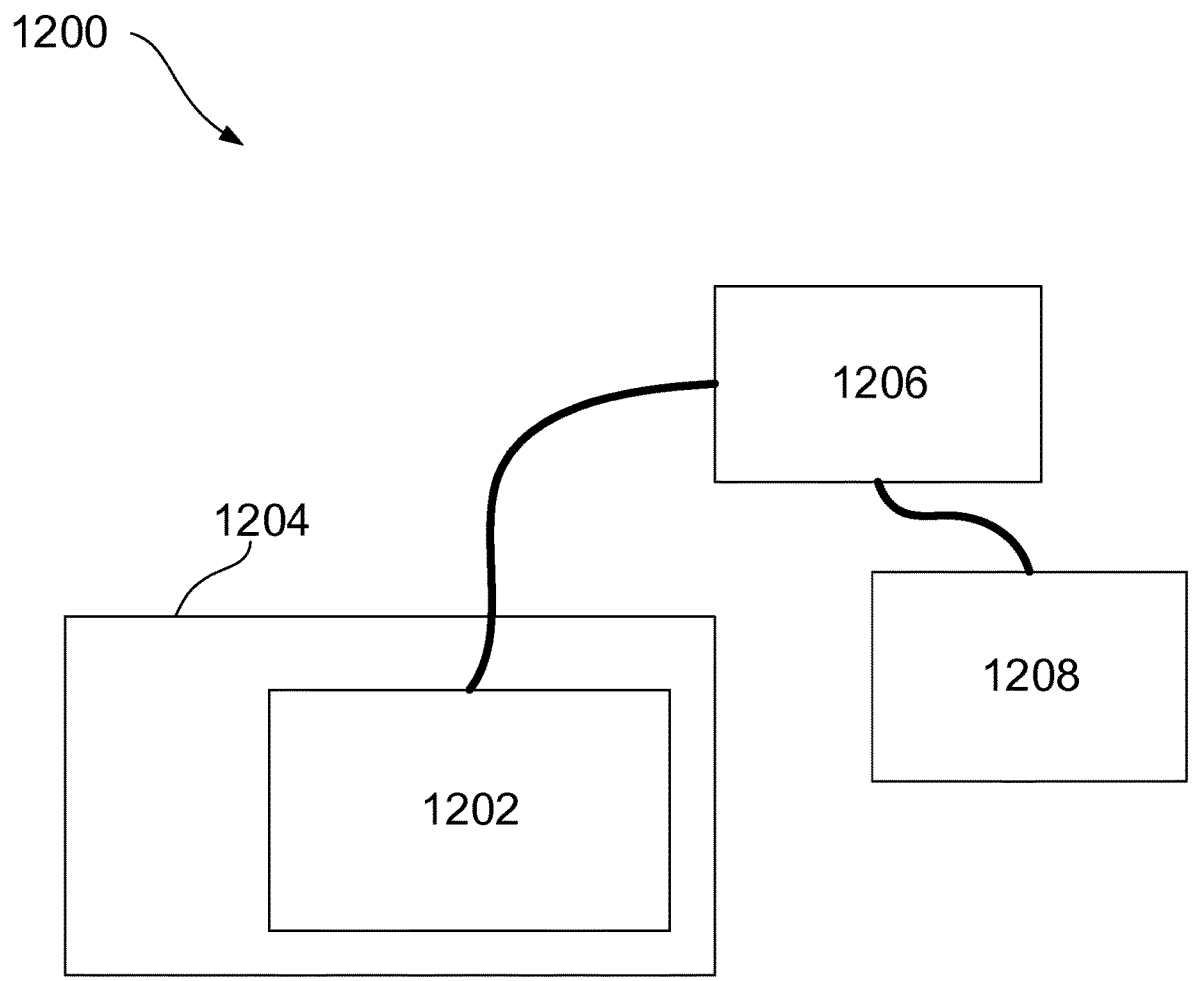
FIG. 11 is a schematic that illustrates an example of a system for performing quantum and/or classical computing operations using the combined quantum and classical processor on the same chip.

FIG. 11 is a schematic that illustrates an example of a system 1200 for performing quantum and/or classical computing operations using the combined quantum and classical processor on the same chip as described herein. The system 1200 includes a chip 1202 on which are formed a classical computing processor and a quantum computing processor. The data inputs/outputs of the quantum computing processor and classical computing processor are accessible to one another through one or more couplers formed on the same chip 1202. The chip 1202 is cooled to an ultra-cold temperature suitable for allowing materials on the chip 1202 to obtain superconductivity using a refrigeration system 1204. The chip 1202 also is coupled to a separate data storage device 1206 having computer readable media suitable for storing computer readable instructions and data including one or more forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. For example, one or more inputs and/or outputs of the classical processor on the chip 1202 can be coupled to the data storage device 1206 for transmitting data to and/or receiving data from the data storage device 1206. To provide for interaction with a user, the system 1200 can include a user interface device 1208, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well. The user interface device 1208 can be coupled to the chip 1202 through a classical data processing apparatus that, in some cases, includes the data storage device 1206. A classical data processing apparatus can include, for example, a CMOS-based computer system.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus comprising: a substrate;
a classical computing processor formed on the substrate;
a quantum computing processor formed on the substrate; and
one or more interprocessor coupling components between the classical computing processor and the quantum computing processor, the one or more interprocessor coupling components being formed on the substrate and being configured to allow data exchange between the classical computing processor and the quantum computing processor, wherein the classical computing processor comprises a plurality of reciprocal quantum logic gates arranged to provide at least one of a digital signal processor and a serial microprocessor, and wherein the one or more interprocessor coupling components comprise an inductive coupler,
wherein the classical computing processor comprises a plurality of classical unit cells, each classical unit cell comprising a plurality of active components, wherein each active component is configured to generate a classical bit,
wherein the quantum computing processor comprises a plurality of quantum unit cells, each quantum unit cell comprising a plurality of qubits,
wherein, for each classical unit cell, a first subset of the plurality of active components is coupled, by interprocessor coupling components, to a respective first subset of qubits within a corresponding quantum unit cell,
wherein, for each classical unit cell, a second subset of the plurality of active components is coupled to the first subset of active components, and
wherein, for each quantum unit cell, a second subset of the plurality of qubits is coupled to the first subset of qubits.

2. The apparatus of claim 1, wherein the quantum computing processor is configured to receive output data from the classical computing processor and use the received output data as input data for a quantum computation to be carried out by the quantum computing processor.

3. The apparatus of claim 2, wherein the quantum computing processor is configured to be programmed using the output data.

4. The apparatus of claim 1, wherein the one or more interprocessor coupling components connect an output of the classical computing processor to an input of the quantum computing processor.

5. The apparatus of claim 1, wherein the one or more interprocessor coupling components connect an output of the quantum computing processor to an input of the classical computing processor.

6. The apparatus of claim 1, wherein each of the quantum computing processor and the classical computing processor comprises a superconducting quantum interference device (SQUID).

7. The apparatus of claim 1, wherein each of the quantum computing processor and the classical computing processor comprises at least one Josephson junction and an inductor.

8. The apparatus of claim 1, wherein the one or more interprocessor coupling components comprise a superconducting wire.

9. The apparatus of claim 1, wherein each of the quantum computing processor and the classical computing processor comprises electronic components comprising a superconducting material.

10. The apparatus of claim 9, wherein the superconducting material comprises aluminum, niobium or a lead alloy.

11. The apparatus of claim 1, wherein the one or more interprocessor coupling components comprise an array of superconducting cavity quantum electrodynamics (QED) transmission lines.

12. The apparatus of claim 1, wherein the classical computing processor formed on the substrate and the quantum computing processor formed on the substrate are part of a single chip.

13. The apparatus of claim 1, wherein the classical computing processor is configured to perform classical annealing computations and the quantum computing processor is configured to perform quantum annealing computations.

14. The apparatus of claim 1, further comprising a magnetic component configured to impose a transverse magnetic field on the substrate,
the magnetic component further being configured to impose a transverse magnetic field of time-varying strength while the quantum computing processor is performing a particular operation, and to impose a transverse magnetic field of zero or negligible strength while the classical computing processor is performing a particular operation.

15. The apparatus of claim 1,
wherein, for each classical unit cell, the second subset of active components is coupled to a subset of active components of another classical unit cell, and
wherein, for each quantum unit cell, the second subset of qubits is coupled to a subset of qubits of another quantum unit cell.

16. The apparatus of claim 15, wherein, for each quantum unit cell, the second subset of qubits is coupled to the subset of qubits of another quantum unit cell by a ferromagnetic coupling.

17. The apparatus of claim 1, wherein the one or more interprocessor coupling components between the classical computing processor and the quantum computing processor comprise a post-processing element,
the post-processing element being configured to do either or both of
(i) receiving data from the quantum computing processor, modifying the data, and sending the modified data to the classical computing processor, and
(ii) receiving data from the classical computing processor, modifying the data, and sending the modified data to the quantum computing processor.

18. The apparatus of claim 1, wherein each of the one or more interprocessor coupling components is configured to be activated by an application of an external current, and to be deactivated by a withdrawal of an external current.

19. The apparatus of claim 9, wherein the electronic components of the quantum computing processor and the electronic components of the classical computing processor comprise the same superconducting material.

20. An apparatus comprising: a substrate;
a classical computing processor formed on the substrate;
a quantum computing processor formed on the substrate; and one or more interprocessor coupling components between the classical computing processor and the quantum computing processor, the one or more interprocessor coupling components being formed on the substrate and being configured to allow data exchange between the classical computing processor and the quantum computing processor, wherein the classical computing processor comprises a plurality of reciprocal quantum logic gates arranged to provide at least one of a digital signal processor and a serial microprocessor, and wherein the one or more interprocessor coupling components comprise an inductive coupler; and a magnetic component configured to impose a transverse magnetic field on the substrate, the magnetic component further being configured to impose a transverse magnetic field of time-varying strength while the quantum computing processor is performing a particular operation, and to impose a transverse magnetic field of zero or negligible strength while the classical computing processor is performing a particular operation.

21. An apparatus comprising:

a substrate;

a classical computing processor formed on the substrate;

a quantum computing processor formed on the substrate; and one or more interprocessor coupling components between the classical computing processor and the quantum computing processor, the one or more interprocessor coupling components being formed on the substrate and being configured to allow data exchange between the classical computing processor and the quantum computing processor, wherein the classical computing processor comprises a plurality of reciprocal quantum logic gates arranged to provide at least one of a digital signal processor and a serial microprocessor, wherein the one or more interprocessor coupling components comprise an inductive coupler, wherein the classical computing processor comprises at least two classical unit cells, each classical unit cell comprising two hidden bits and either two output bits or two input bits, each hidden bit coupled via a corresponding first intraprocessor coupling component to a corresponding hidden bit of another classical unit cell and also coupled via respective second and third intraprocessor coupling components to the input bits or output bits of the same unit cell, and wherein the quantum computing processor comprises at least two quantum unit cells, each quantum unit cell comprising two hidden qubits and either two output qubits or two input qubits, each hidden qubit coupled via a corresponding fourth intraprocessor coupling component to a corresponding hidden qubit of another quantum unit cell and also coupled via respective fifth and sixth intraprocessor coupling components to the input qubits or output qubits of the same unit cell, each output bit being coupled via a corresponding first interprocessor coupling component to a corresponding input qubit, and each output qubit being coupled via a corresponding second interprocessor coupling component to a corresponding input bit.

\* \* \* \* \*